United States Patent [19]

Young

[11] Patent Number: 4,558,278

[45] Date of Patent: Dec. 10, 1985

[54] NUCLEAR MAGNETIC RESONANCE METHODS AND APPARATUS

[75] Inventor: Ian R. Young, Sunbury-on-Thames, England

[73] Assignee: Picker International, Limited, Wembley, England

[21] Appl. No.: 556,010

[22] Filed: Nov. 29, 1983

[30] Foreign Application Priority Data

Dec. 17, 1982 [GB] United Kingdom ............... 8236043

[51] Int. Cl.$^4$ ............................................. G01R 33/08
[52] U.S. Cl. ................................. 324/309; 324/307; 324/311
[58] Field of Search ............... 324/300, 307, 309, 311, 324/314

[56] References Cited

U.S. PATENT DOCUMENTS

| | | | |
|---|---|---|---|
| 4,115,730 | 9/1978 | Mansfield | 324/309 |
| 4,297,637 | 10/1981 | Crooks | 324/309 |
| 4,318,043 | 3/1982 | Crooks | 324/309 |
| 4,319,190 | 3/1982 | Brown | 324/309 |
| 4,471,306 | 9/1984 | Edelstein | 324/309 |

FOREIGN PATENT DOCUMENTS

| | | | |
|---|---|---|---|
| 1578910 | 11/1980 | United Kingdom | 324/309 |
| 2056078 | 3/1981 | United Kingdom | 324/309 |

*Primary Examiner*—Michael J. Tokar
*Attorney, Agent, or Firm*—Watts, Hoffman, Fisher & Heinke Co.

[57] ABSTRACT

A multi-slice method of NMR imaging wherein a number of discrete slices $S_1$, $S_2$, $S_3$, $S_4$ are excited simultaneously by using the usual field gradient Gz but an r.f. pulse $B_1$ which is a mix of a number of pulses of different discrete frequencies, $f_1$, $f_2$, $f_3$, $f_4$, and recovering data in the presence of an alternating gradient $G_2z$ in the same direction as used to establish the slices such that discrete spin echo signals of different frequency occur for each slice. Apparatus for use in the method is also disclosed.

4 Claims, 4 Drawing Figures

NUCLEAR MAGNETIC RESONANCE METHODS AND APPARATUS

This invention relates to methods for obtaining a representation of the spatial distribution in a body of a quantity relating to nuclear magnetic resonance (NMR) and apparatus for use therein.

NMR methods have been used for the chemical analysis of materials for many years. More recently NMR methods have been used to obtain images representing the distribution over a selected cross-sectional slice of a body of a chosen quantity, e.g. the density of chosen nuclei for example hydrogen nuclei, or of NMR spin relaxation time constants. The time taken to obtain such images is determined primarily by the NMR spin relaxation time constants, and can amount to an appreciable period, particularly if images of more than one slice are required.

It is an object of the present invention to provide a method of obtaining a representation of the spatial distribution of a quantity relating to NMR wherein this problem is alleviated by obtaining representations of several discrete slices of a body substantially simultaneously.

According to the present invention a method of obtaining a representation of the spatial distribution in a plurality of substantially parallel slices of a body of a quantity relating to nuclear magnetic resonance includes: applying a uniform magnetic field to said body; imposing a first gradient on said field in a chosen direction; applying a plurality of r.f. field pulses each within a different discrete frequency band so as to excite nuclear magnetic resonance preferentially in a plurality of spaced parallel planar slices of said body whose planes lie perpendicular to said chosen direction removing said first gradient, and subsequently applying a second gradient on said field in said chosen direction, the direction of said second gradient being periodically reversed; detecting nuclear magnetic resonance signals occurring while said second gradient is imposed; and processing said signals to derive data relating to each of said plurality of slices.

Preferably at least one further gradient parallel to the planes of said slices is imposed on said field so as to disperse the resonance within each of said slices.

The invention also provides an apparatus arranged to obtain a representation of the spatial distribution in a plurality of substantially parallel slices of a body of a quantity relating to nuclear magnetic resonance including: means arranged to apply a uniform nagnetic field; means arranged to impose a first gradient on said field in a chosen direction; means arranged to apply a plurality of r.f. field pulses each within a different discrete frequency band; means arranged to remove said first magnetic field, and subsequently apply a second gradient on said field in said chosen direction, the direction of said second gradient being periodically reversed; means arranged to detect nuclear magnetic resonance signals occurring while said second magnetic field is imposed; and means arranged to process said signals to derive data relating to each of said plurality of slices.

One method in accordance with the invention together with apparatus arranged to carry out this method will now be described, by way of example only, with reference to the accompanying drawings in which.

The method is performed using an apparatus similar to that described in U.K. Pat. Specification No. 1578910 or No. 2056078, to which reference should be made for a fuller description, appropriately programmed to apply a sequence of magnetic field gradient and r.f. pulses and analyse the resulting signals as hereafter described.

The essential features of such an apparatus in so far as is required for an understanding of the present invention are as follows:

The apparatus includes a first coil system whereby a magnetic field can be applied to a body to be examined in a given direction, mormally designated the Z-direction, with a gradient in any one or more of the three orthogonal directions i.e. X, Y and Z directions.

Figure 1:
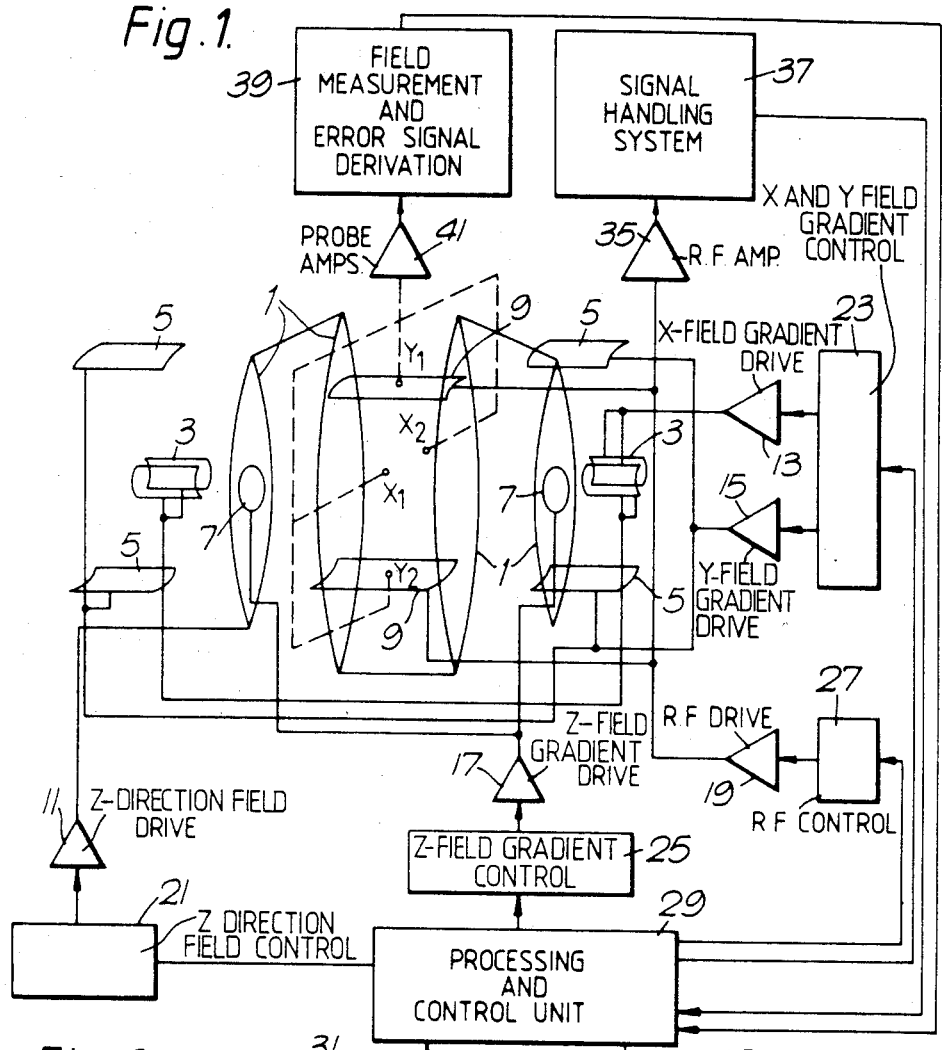
FIGS. 1 and 2 illustrate the apparatus diagrammatically.

Referring to FIG. 1, the first coil system comprises coils 1 capable of providing a steady uniform magnetic field in the Z direction; coils 3 capable of imposing a magnetic field gradient in the X direction, coils 5 capable of imposing a magnetic field gradient in the Y direction; and coils 7 capable of imposing a magnetic field gradient in the Z direction.

In addition, the apparatus includes a second coil system 9 whereby r.f. magnetic fields can be applied to the body under examination in a plane normal to the direction of the steady uniform magnetic field produced by the first coil system, and whereby r.f. magnetic fields resulting from nuclei in the body under examination which have been excited to nuclear magnetic resonance with a spin vector component other than in the Z direction can be detected.

In the drawing a single pair of coils 9 is shown for both applying and detecting r.f. fields, but in certain circumstances it may be preferable to provide separate coils for detecting the r.f. fields.

The various coils 1, 3, 5, 7 and 9 are driven by drive amplifiers 11, 12, 13, 15, 17 and 19 respectively, controlled by control circuits 21, 23 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing for application to the display to produce an image representing the distribution of an NMR quantity in the body being examined.

It will be appreciated that whilst shown separately to clarify the present description, the signal handling system 37 may conveniently form part of the unit 29.

Figure 2:
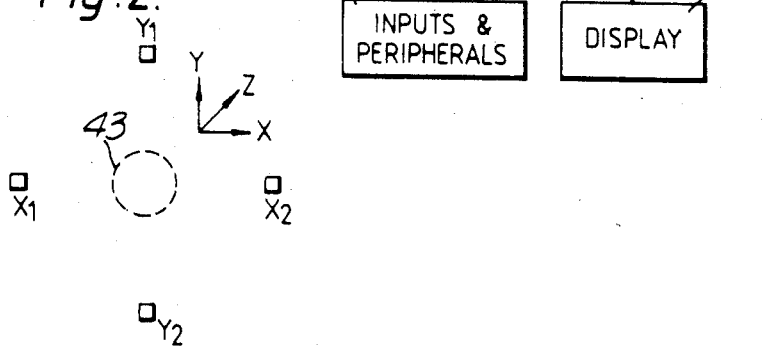

The apparatus also includes field measurement and error signal circuits 39 which receive signals via amplifiers 41 from field probes $X_1$, $X_2$, $Y_1$ and $Y_2$ which are disposed at suitable positions in relation to the portion 43 of the body being examined, as illustrated in FIG. 2, to monitor the applied magnetic fields.

Figure 3:
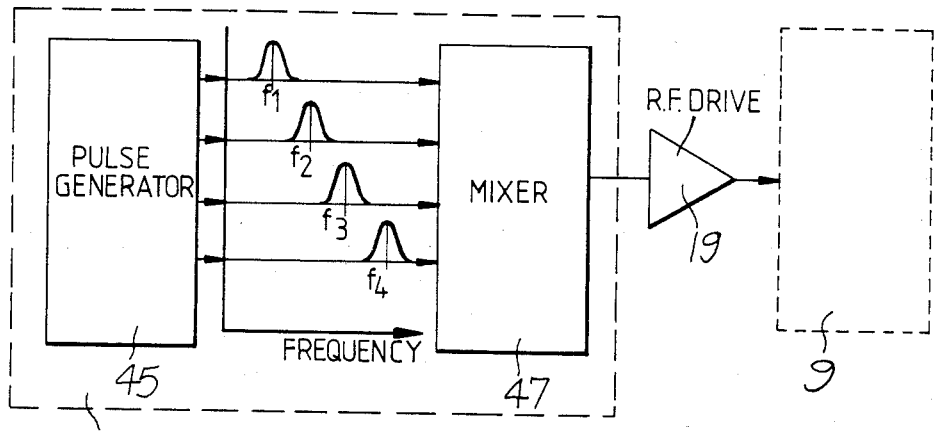
FIG. 3 is a schematic diagram of a detail of part of the apparatus of FIG. 1.

The apparatus, however, differs from the known forms of apparatus, in that the R.F. control circuit 27 includes an arrangement shown schematically in FIG. 3. This comprises a pulse generator 45 capable of simultaneously generating four r.f. pulses each having a limited bandwidth, e.g. of about 5 KHz, and each centred on a different one of four frequencies f1, f2, f3 and f4 such that the frequency bands of the pulses are discrete. The various outputs from the pulse generator 45 are combined in mixer 47, to produce a composite r.f. pulse which is fed via the r.f. drive amplifier 19 to the second coil system 9.

Figure 4:
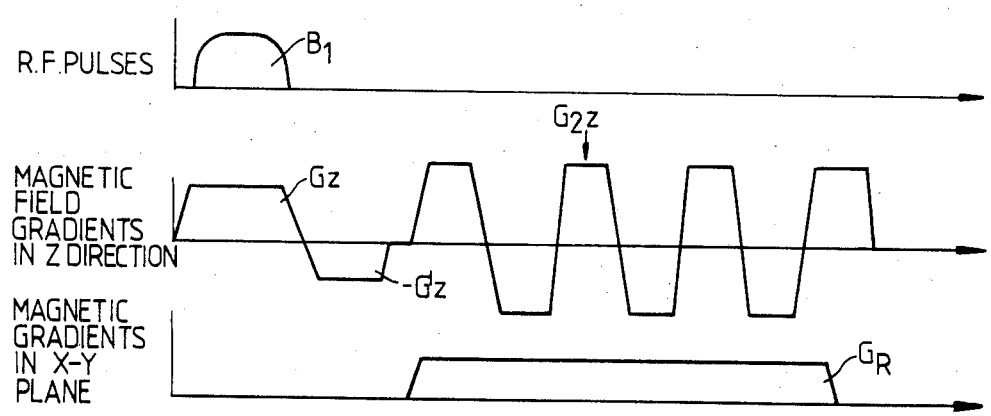
FIG. 4 illustrates the magnetic field sequence employed in the method.

Referring now to FIG. 4, in use of the apparatus a steady uniform magnetic field, Bo is applied by the first coil system to the body under examination in the Z direction. This field serves to define the equilibrium axis of magnetic alignment of nuclei in the body, i.e. along the Z direction, and remains constant throughout the examination procedure. An additional magnetic field Bz in the Z direction such as to impose a magnetic field gradient Gz in the Z direction is then applied by the coils 7, together with an r.f. magnetic field pulse $B_1$ produced by the arrangement shown in FIG. 3. The magnetic field pulse $B_1$ is thus a composite pulse consisting of four component pulses having frequencies centred at f1, f2, f3 and f4. Each of these frequencies is chosen to be the Larmor frequency for hydrogen nuclei in a different one of four spaced parallel slices of the portion 43 of the body normal to the Z direction, $S_1$, $S_2$, $S_3$ and $S_4$ respectively, defined by four particular values of the magnetic field along the Z direction. The integral of the components of the pulse $B_1$ are chosen to be just sufficient to tip the spins of the excited nuclei into the X-Y plane, the spins then precessing in the X-Y plane round the Z axis.

The gradient Gz is then removed and replaced by a gradient in the opposite sense —Gz. This causes the rephasing the spins within the four slices which have been selectively excited by the combination of the r.f. pulse $B_1$, the steady uniform field Bo, and the gradient field Bz, the dephasing having been caused by the gradient through each of the slices $S_1$, $S_2$, $S_3$, $S_4$. The magnitude of —Gz is such that the spins are substantially all rephased at the time at which this gradient is switched off as described, for example, in the above mentioned U.K. pat. specification No. 1,578,910 the excited spins within the four slices then precessing at the same frequency within the same magnetic field. A further magnetic field in the Z direction is then applied by the coils 3, 5 such as to impose a gradient $G_R$ in a direction orthogonal to the Z direction, this further field being a composite of two fields respectively imposing gradients in the X and Y directions. A gradient $G_2z$ of substantially greater magnetude than $G_R$ is also imposed on the field along the Z direction, the direction of the gradient $G_2z$ being periodically reversed. The effect of the reversing of the gradient $G_2z$ is to generate a series of spin echoes after the initial free induction delay signal within each of the four chosen slices $S_1$, $S_2$, $S_3$, $S_4$. The effect of the $G_R$ gradient is to cause a frequecy dispersion of the resonance across each of the four slices in the direction of the $G_R$ gradient. During this period the r.f. signals generated by the excited nuclei within the four slices are sampled, and the data thus derived is subjected to a Fourier Transformation process. Due to the fact that a periodic time dependence is introduced by the periodic reversal of the gradient $G_2z$, a discreteness of the signals from along the Z direction is introduced. Thus the Fourier Transformation process yields four spectra, one for each of the slices $S_1$, $S_2$, $S_3$ and $S_4$, each centred on one of four different frequencies. Each spectra has a frequency distribution which contains information about the spatial distribution of frequency of the whole of each of the respective slices as projected onto the direction of $G_R$ within the slices.

In order to obtain a two-dimensional NMR image of each of the slices $S_1$, $S_2$, $S_3$, $S_4$ the r.f. and gradient field sequence together with the processing sequence described herebefore is repeated for each of a large number of different orientations e.g. 180 within the X-Y plane. The images for the four slices are then obtained from the four sets of spatial distribution data for each orientation by a reconstruction technique such as the back projection processing technique.

It will be appreciated that although the method described herebefore is a method using a projection reconstruction technique, a method in accordance with the invention may alternatively use a two-dimensional Fourier Transformation technique to construct an image, such as described, for example, in J.Mag.Res.29, p.355-373 (1978), J.Mag.Res.18, p.69-83 (1975) and U.K. Pat. Specification No. 2056078.

It will also be appreciated that although the method described herebefore relates to obtaining the spatial distribution of a quantity relating to nydrogen nuclei within the body, the method is equally applicable to any other nuclei having a mahnetic spin by appropriate choice of the r.f. pulse frequencies.

It will also be appreciated that whilst the method described herebefore relates to obtaining images of a number of slices whose planes are orthogonal to the direction of Bo by using a slice selection gradient parallel to Bo, it is equally applicable to a number of slices whose planes lie at a different angle to the direction of Bo by appropriate choice of the direction of the slice selection gradient. In particular in medical applications images of transverse, sagittal and coronal slices may be obtained without moving the patient

I claim:

1. A method of obtaining a representation of the spatial distribution in a plurality of substantially parallel slices of a body of a quantity relating to nuclear magnetic resonance including applying a uniform magnetic field to said body; imposing a first gradient on said field in a chosen direction; applying a plurality of r.f. field pulses each within a different discrete frequency band so as to excite nuclear magnetic resonance preferentially in a plurality of spaced parallel planar slices of said body whose planes lie perpendicular to said chosen direction; removing said first gradient, and subsequently applying a second gradient on said field in said chosen direction, the direction of said second gradient being periodically reversed; detecting nuclear magnetic resonance signals occurring while said second gradient is imposed; and processing said signals to derive data relating to each of said plurality of slices.

2. A method according to claim 1 in which at least one further gradient parallel to the planes of said slices is imposed on said field so as to disperse the resonance within each of said slices.

3. An apparatus arranged to obtain a representation of the spatial distribution in a plurality of substantially parallel slices of a body of a quantity relating to nuclear magnetic resonance including: means arranged to apply a uniform magnetic field; means arranged to impose a first gradient on said field in a chosen direction; means arranged to apply a plurality of r.f. field pulses each within a different discrete frequency band; means arranged to remove said first magnetic field, and subsequently apply a second gradient on said field in said chosen direction, the direction of said second gradient being periodically reversed; means arranged to detect nuclear magnetic resonance occurring while said second magnetic field is imposed; and means arranged to process said signals to derive data relating to each of said plurality of slices.

4. An apparatus according to claim 3 including means arranged to impose at least one further gradient on said field parallel to the planes of said slices.

* * * * *